(12) United States Patent
Sahbari et al.

(10) Patent No.: US 6,531,436 B1
(45) Date of Patent: Mar. 11, 2003

(54) POLYMER REMOVAL

(75) Inventors: Javad J. Sahbari, Sunnyvale, CA (US); Shawn J. Sahbari, Sunnyvale, CA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 09/514,065

(22) Filed: Feb. 25, 2000

(51) Int. Cl.[7] ............................. C11D 3/44; B08B 3/08
(52) U.S. Cl. ......................... 510/176; 134/2; 510/254; 510/255
(58) Field of Search .................. 430/256, 7, 260, 430/281, 329, 318, 313, 331; 134/38, 2, 40; 510/175, 176, 177, 178; 360/122, 126; 252/548; 438/745, 594

(56) References Cited

U.S. PATENT DOCUMENTS

| | | | |
|---|---|---|---|
| 4,401,747 A | 8/1983 | Ward, Jr. et al. | |
| 4,518,675 A | 5/1985 | Kataoka | |
| 4,970,615 A * | 11/1990 | Gau | 360/122 |
| 5,334,332 A | 8/1994 | Lee | |
| 5,407,788 A | 4/1995 | Fang | |
| 5,480,585 A | 1/1996 | Shiotsu et al. | |
| 5,563,119 A | 10/1996 | Ward | |
| 5,753,601 A | 5/1998 | Ward et al. | |
| 5,795,702 A * | 8/1998 | Tanabe et al. | 430/331 |
| 5,988,186 A | 11/1999 | Ward et al. | |

FOREIGN PATENT DOCUMENTS

| EP | 0 773 480 A1 | 5/1997 |
|---|---|---|
| EP | 0 828 197 A1 | 3/1998 |

* cited by examiner

*Primary Examiner*—Yogendra N. Gupta
*Assistant Examiner*—Gregory E.. Webb
(74) *Attorney, Agent, or Firm*—S. Matthew Cairns

(57) ABSTRACT

Disclosed are compositions useful for the removal of polymeric material from substrates, such as electronic devices. The compositions of the present invention are particularly suitable for removing polymer residues from advanced magnetic devices. Also disclosed are methods of removing such polymeric material.

10 Claims, No Drawings

POLYMER REMOVAL

BACKGROUND OF THE INVENTION

The present invention relates generally to the field of removal of polymeric materials from a substrate. In particular, the present invention relates to compositions and methods for the removal of polymeric material from electronic devices.

Numerous materials containing polymers are used in the manufacture of electronic devices, such as circuits, disk drives, storage media devices and the like. Such polymeric materials are found in photoresists, solder masks, antireflective coatings, and the like. During manufacture of such electronic devices, the polymeric material is subjected to conditions that make the removal of such polymeric material difficult.

For example, modern technology utilizes positive-type resist materials for lithographically delineating patterns onto a substrate so that the patterns can be subsequently etched or otherwise defined into the substrate material. The resist material is deposited as a film and the desired pattern is defined by exposing the resist film to energetic radiation. Thereafter the exposed regions are subject to a dissolution by a suitable developer liquid. After the pattern has been thus defined in the substrate the resist material must be completely removed from the substrate to avoid adversely affecting or hindering subsequent operations or processing steps.

It is necessary in such a photolithographic process that the photoresist material, following pattern delineation, be evenly and completely removed from all unexposed areas so as to permit further lithographic operations. Even the partial remains of a resist in an area to be further patterned is undesirable. Also, undesired resist residues between patterned lines can have deleterious effects on subsequent processes, such as metallization, or cause undesirable surface states and charges.

In fabrication of magnetic thin film heads ("TFH") for disk drive and data storage media devices, photoresists are commonly applied on a variety of thin films as masking agents for precision design of magnetoresistive and giant magnetoresistive heads. Although the photolithography and reactive ion etches used resemble semiconductor processes, these sliders, i.e. magnetoresistive ("MR") or giant magnetoresistive ("GMR") heads, are built in the millions of units, on aluminum titanium carbide ("AlTiC") ceramic wafers. Common thin films associated with magnetoresistive heads include aluminum oxide ("$Al_2O_3$"), gold ("Au"), cobalt ("Co"), copper ("Cu"), iron ("Fe"), iridium ("Ir"), manganese ("Mn"), molybdenum ("Mo"), nickel ("Ni"), platinum ("Pt"), ruthenium ("Ru"), and zirconium ("Zr"). These films are completely different from those found in integrated circuit semiconductor fabrication which include predominantly aluminum ("Al"), tungsten ("W"), titanium ("Ti"), and silicon oxides as the interlayer dielectrics.

Within the last five years the technology for storage media has grown exponentially and has driven slider performance through miniaturization and higher area density which today exceeds 20 $Gb/in^2$. In order to keep at pace with next generation technology, read-write head manufacturers are utilizing advanced photoresists and multi component ion etch recipes to achieve the desired thin film stack patterns. Furthermore, to successfully integrate multiple film stacks into sub-micron features with the correct magnetic and signal sensitivity each layer within the device must be clean from polymer, ionic and other forms of organic/inorganic contamination or residue. Such undesired residue will adversely affect the device performance and reliability.

Traditional chemistry used in cleaning processes of thin film heads, including photoresist strip and metal lift-off, do not offer acceptable performance for modern head technology. Known photoresist removal or stripping formulations are typically contain strong alkaline solutions, organic polar solvents or strong acids and oxidizing agents. Typical organic polar solvents include pyrolidones such N-methyl pyrrolidone, N-ethyl pyrrolidone, N-hydroxyethyl pyrrolidone and N-cyclohexyl pyrrolidone; amides including dimethylacetamide or dimethylformamided; phenols and derivatives thereof. Such solvents have been used in combination with amines or other alkaline material. For example, U.S. Pat. No. 5,334,332 (Lee) discloses a composition for removing etching residue containing 5 to 50% hydroxylamine, 10 to 80% of at least one alkanolamine, and water. U.S. Pat. No. 4,401,747 (Ward et al.) discloses a stripping composition containing 30 to 90% 2-pyrrolidinone and 10 to 70% dialkyl sulfone.

Known stripping formulations are not effective in MR/GMR or spin valve head manufacture due to the corrosive nature of such formulations toward the metals used in thin film head manufacture. Thin film heads are unlike semiconductor devices and are ultra sensitive to galvanic and water induced mouse-bite corrosion, as well as, electrostatic discharge ("ESD"). For these reasons, modern thin film head back-end processes are now DI water-free and utilize isopropanol for rinse and dry steps of the cleaning sequence. This helps to minimize pole tip recession and corrosion at the thin film head level.

For example, U.S. Pat. No. 4,518,675 (Kataoka) discloses stripping compositions including dimethylsulfoxide and at least one compound selected form alkali metal alkoxides, alkali metal hydroxides and tetraalkylammonium hydroxides. Such stripping compositions are corrosive to thin films used in the manufacture of thin film heads.

In addition, known stripping compositions have numerous other drawbacks including, undesirable flammability, toxicity, volatility, odor, necessity for use at elevated temperatures such as up to 100° C., and high cost due to the handling of regulated materials.

There is thus a continuing need for strippers that effectively remove polymeric material, are more environmentally compatible and do not cause corrosion of the substrate, particularly thin metal films in the substrate.

SUMMARY OF THE INVENTION

It has been surprisingly found that polymeric material may be easily and cleanly removed from substrates, particularly thin film heads for disk drive and storage media devices. Such polymeric material may be removed according to the present invention without corrosion of underlying metal layers. Yield losses due to corrosion or erosion are also improved by using the stripping compositions of the present invention.

In one aspect, the present invention provides a composition for the removal of polymeric material from a substrate including one or more polar aprotic solvents, one or more polymer dissolution enhancing bases, and one or more corrosion inhibitors, wherein the composition is substantially free of hydroxylamine or hydroxylamine derivatives.

In a second aspect, the present invention provides a method of removing polymeric material from a substrate including the step of contacting a substrate containing polymeric material to be removed with the composition described above.

In a third aspect, the present invention provides a method for preparing thin film heads including the steps of contacting a thin film head precursor containing polymeric material to be removed with a composition including one or more polar aprotic solvents, one or more polymer dissolution enhancing bases, one or more corrosion inhibitors and one or more organic additives for a period of time sufficient to remove the polymeric material and rinsing the substrate.

DETAILED DESCRIPTION OF THE INVENTION

As used throughout this specification, the following abbreviations shall have the following meanings unless the context clearly indicates otherwise: DMSO=dimethyl sulfoxide; TMAH=tetramethylammonium hydroxide; NMP=N-methylpyrrolidone; DPM=dipropylene glycol monomethyl ether; TPM=tripropylene glycol monomethyl ether; AEEA=aminoethylaminoethanol; DI=deionized; % wt=percent by weight; mL=milliliter; ° C.=degrees Centigrade; ppb=parts per billion; and min=minute. All percents are by weight. All numerical ranges are inclusive.

The terms "stripping" and "removing" are used interchangeably throughout this specification. Likewise, the terms "stripper" and "remover" are used interchangeably. "Alkyl" refers to linear, branched and cyclic alkyl. As used throughout this specification, the term "aprotic" refers to compounds that do not accept or yield a proton.

The compositions of the present invention include one or more polar aprotic solvents, one or more polymer dissolution enhancing bases, and one or more corrosion inhibitors. Any polar aprotic solvent is suitable for use in the present invention. Suitable polar aprotic solvents include, but are not limited to, dimethyl sulfoxide, tetramethylene sulfone (or sulfolane), and dimethyl sufur dioxide. It is preferred that the polar aprotic solvent is dimethyl sulfoxide or sulfolane. Such polar aprotic solvents are generally commercially available from a variety of sources, such as Aldrich Chemical Company (Milwaukee, Wis.) and may be used without further purification.

The polar aprotic solvents of the present invention are typically used in an amount in the range of from about 20% wt to about 90% wt, preferably from about 40% wt to about 80% wt, and more preferably from about 60% wt to about 75% wt, based on the total weight of the composition.

Any base which enhances the dissolution of the polymeric material to be removed is suitable for use in the present invention. Suitable polymer dissolution enhancing bases include, but are not limited to, tetra($C_1$–$C_6$)alkylammonium hydroxide such as tetramethylammonium hydroxide and tetrabutylammonium hydroxide; tetra($C_1$ $C_6$) alkylammonium carbonate such as tetramethylammonium carbonate; tetra($C_1$–$C_6$)alkylammonium acetate such as tetramethylammonium acetate; tetra($C_1$–$C_6$)alkylammonium citrate such as tetramethylammonium citrate; tetra($C_1$–$C_6$) alkylammonium silicate such as tetramethylammonium silicate; or choline hydroxide. It is preferred that the first polymer dissolution enhancing base is selected from one or more of tetramethylammonium hydroxide, tetramethylammonium carbonate, tetramethylammonium acetate or tetramethylammonium citrate. Tetramethylammonium hydroxide is typically used as the pentahydrate. It is preferred that the polymer dissolution enhancing bases are free of metal ions, particularly sodium, potassium and the like. It is further preferred that the polymer dissolution enhancing bases of the present invention are free of hydroxylamine and hydroxylamine derivatives, such as hydroxylamine formate and hydroxylamine buffered with carboxylic acid. Such first polymer dissolution enhancing bases are generally commercially available, such as from Aldrich (Milwaukee, Wis.) and may be used without further purification.

Typically, the one or more polymer dissolution enhancing bases are present in an amount of from about 0.1 to about 10% wt, based on the total weight of the composition. It is preferred that the polymer dissolution enhancing bases are present in an amount of from about 1 to about 5 % wt, and more preferably from about 2 to about 4% wt. When more than one polymer dissolution enhancing bases is used in the present invention, such bases may be combined in any ratio.

Any corrosion inhibitor which reduces the corrosion of thin metal film layers is suitable for use in the present invention. Suitable corrosion inhibitors include, but are not limited to, catechol, ($C_1$–$C_6$)alkylcatechol such as methylcatechol, ethylcatechol and tert-butylcatechol, benzotriazole, ($C_1$–$C_{10}$)alkylbenzotriazoles; ($C_1$–$C_{10}$) hydroxyalkylbenzotriazoles; 2-mercaptobenimidazole, gallic acid; gallic acid esters such as methyl gallate and propyl gallate; and the like. It is preferred that the corrosion inhibitor is catechol, ($C_1$–$C_6$)alkylcatechol, benzotriazole or ($C_1$–$C_{10}$)alkylbenzotriazoles, 2-mercaptobenimidazole and more preferably benzotriazole. Such corrosion inhibitors are generally commercially available from a variety of sources, such as Aldrich (Milwaukee, Wis.) and may be used without further purification.

In an alternate embodiment, the polymer enhancing dissolution base may also function as a corrosion inhibitor. Thus, such dual function polymer enhancing bases are contemplated in the present invention. For example, tetramethylammonium silicate may be used as the polymer dissolution enhancing base, the corrosion inhibitor, or both according to the present invention.

The corrosion inhibitors are typically present in the compositions of the present invention in an amount in the range of from about 0.01 to about 10% wt, based on the total weight of the composition. It is preferred that the amount of corrosion inhibitor is from about 0.2 to about 5% wt, more preferably about 0.5 to about 3% wt, and most preferably from about 1.5 to about 2.5% wt.

The compositions of the present invention are substantially free of added water and preferably free of added water. A small amount of water may be present when the polymer dissolution enhancing base contains water of crystallization. No other water is added to the compositions of the present invention. The compositions of the present invention are substantially free of hydroxylamine or hydroxylamine derivatives, such as hydroxylamine formate and hydroxylamine buffered with carboxylic acid, and preferably free of hydroxylamine or hydroxylamine derivatives.

The compositions of the invention may further contain one or more optional organic additives. Suitable optional additives include, but are not limited to, cosolvents, surfactants, chelating agents and the like.

Suitable cosolvents include, but are not limited to, ($C_1$–$C_{20}$)alkanediols such as ethylene glycol, diethylene glycol, propylene glycol, 2-methylpropanediol and dipropylene glycol; ($C_1$–$C_{20}$)alkanediol ($C_1$–$C_6$)alkyl ethers such as propylene glycol monomethyl ether, propylene glycol dimethyl ether, propylene glycol n-butyl ether, dipropylene glycol monomethyl ether, dipropylene glycol dimethyl ether, dipropyleneglycol monobutyl ether, tripropyleneglycol monomethyl ether and propylene glycol methyl ether acetate; aminoalcohols such as aminoethylaminoethanol; N-($C_1$–$C_{10}$)alkylpyrrolidones such as N-methylpyrrolidone, N-ethylpyrrolidone, N-hydroxyethylpyrrolidone and N-cyclohexylpyrrolidone; and the like. It is preferred that the cosolvent is one or more of ($C_1$–$C_{20}$)alkanediols, and ($C_1$–$C_{20}$)alkanediol ($C_1$–$C_6$)alkyl ethers, and more preferably one or more of propylene glycol monomethyl ether, propylene glycol dimethyl ether, propylene glycol n-butyl ether, dipropylene glycol monomethyl ether, dipropylene glycol dimethyl ether, dipropyleneglycol n-butyl ether, tripropylene glycol monomethyl ether and propylene glycol methyl ether acetate. It is further preferred that the compositions of the present invention are free of amine cosolvent, such as aminoalcohols.

When such cosolvents are used they are typically present in an amount in the range of about 5 to about 80% wt, based on the total weight of the composition, and preferably about 10 to about 45% wt. It is preferred that one or more cosolvents are used in the present invention. When such cosolvent is present in the compositions of the present invention, the effectiveness of the compositions at removing polymeric material is enhanced as compared to the use of the solvent alone. It is preferred that the weight ratio of polar aprotic solvent to cosolvent is in the range of 50:50 to 95:5, preferably 60:40 to 80:20, and more preferably at a ratio of 75:25.

Nonionic and cationic surfactants may be used with the stripping compositions of the present invention. Nonionic surfactants are preferred. Such surfactants are generally commercially available. The surfactants are typically present in an amount of from about 0.2 to about 5% wt, preferably from about 0.5 to about 3% wt, and more preferably from about 1 to about 2.5% wt, based on the total weight of the composition.

The compositions of the present invention may be prepared by combining the one or more polar aprotic solvents, one or more polymer dissolution enhancing bases, one or more corrosion inhibitors and one or more organic additives in any order. When a cosolvent is used, it is preferred that the polar aprotic solvent and cosolvent are blended first, followed by the one or more polymer dissolution enhancing bases, corrosion inhibitor and then by any other optional additives.

An advantage of the polymer removal compositions of the present invention is that they are substantially non-corrosive to substrates containing metals, particularly copper. It is preferred that the compositions of the present invention are non-corrosive to metals, particularly copper.

The compositions of the present invention are suitable for removing polymeric material from a substrate. Suitable polymeric material that can be removed by the present invention is any residue from photoresists, soldermasks, antireflective coatings, and the like.

An advantage of the process of the present invention is that lower temperatures may be used than those used with known stripping compositions. Typically, the polymeric residue removal process of the present invention may be carried out at any temperature, such as from room temperature to about 120° C., preferably from about 35° to about 85° C., more preferably from about 50° C. to about 85° C., and most preferably from about 70° to about 85° C. It is preferred that the polymer removal compositions of the present invention be heated. It will be appreciated by those skilled in the art that the polymer removal compositions of the present invention may be heated by a variety of means.

Polymeric residue on a substrate may be removed by contacting the substrate with a composition of the present invention. The substrate may be contacted with the compositions of the present invention by any known means, such as by placing the substrate in a vessel containing a composition of the present invention or by spraying a composition of the present invention on the substrate. When the substrate is placed in a vessel, it is preferred that the level of the compositions of the present invention in the vessel be sufficient to completely immerse the polymer residue on the substrate. After the substrate has been contacted with the compositions of the present invention for a period of time sufficient to remove the polymer residue, the substrate is removed from contact with the compositions of the present invention, rinsed with DI water and dried, such as by using a spin dry process.

The compositions of the present invention are particularly useful in the manufacture of thin film head containing electronic devices. Thin film heads can be prepared according to the present invention by contacting a thin film head precursor containing polymeric material to be removed with a composition including one or more polar aprotic solvents, one or more polymer dissolution enhancing bases, one or more corrosion inhibitors and one or more organic additives for a period of time sufficient to remove the polymeric material and rinsing the substrate. The thin film head is then removed from contact with the composition, rinsed, such as with water or isopropanol, and dried, such as by spin drying or under nitrogen.

The compositions of the present invention are substantially non-corrosive to substrates containing metals, particularly copper and nickel-iron. It is preferred that the compositions of the present invention are non-corrosive to metals, particularly copper. The compositions of the present invention are effective at removing stubborn photoresist and other process residues faster and easier than conventional photoresist stripping formulations and individual component solvents.

The following examples are intended to illustrate further various aspects of the present invention, but are not intended to limit the scope of the invention in any aspect.

EXAMPLE 1

Thin film head (4 inch, 10 cm) ceramic wafers containing coatings of any of the following metals or alloys thereof: nickel-iron ("Ni—Fe"), nickel, cobalt, platinum and aluminum oxide, were coated with a commercial photoresist, AZ 1400, using standard application techniques. In each case, the photoresist was hard baked and processed under typical conditions. The remaining photoresist was then removed by immersing the wafers in a 500 mL bath each of Samples 1–3. The formulations of each of Samples 1–3 are reported in Table 1. All amounts are by weight, based on the total weight of the composition.

TABLE 1

| Sample | Composition |
| --- | --- |
| 1 | 60% DMSO, 37.5% DPM, 2.5% TMAH, 1–1.5% benzotriazole |
| 2 | 70% DMSO, 28% DPM, 2% TMAH, 1–1.5% benzotriazole |
| 3 | 75% DMSO, 20% DPM, 2.5% TMAH, 2.5% DI water, 1–1.5% tert-butyl catechol |

Each bath was heated to 75° C. and the wafers remained in the bath for 20 minutes. The wafers were then rinsed with DI water, dried under a nitrogen stream and evaluated for polymer residues. The wafers were also examined for evidence of corrosion. The results are reported in Table 2.

TABLE 2

| Sample | Thin Film | Polymer Removal Results | Corrosion |
| --- | --- | --- | --- |
| 1 | 100% copper | clean—no residue | no corrosion |
| 2 | Al₂O₃, Al/Cu, Si, Ti/Ti—N | clean—no residue | no corrosion |
| 3 | Al₂O₃, Al/Cu, Si, W, Ti, Ti—N | clean—no residue | no corrosion |

The above data clearly show that the compositions of the present invention are effective in removing polymeric residue from a substrate.

EXAMPLE 2

Electroplated copper wafers (100% copper) were tested. Two inch by two inch (5 cm×5 cm) pieces of the 100% copper wafers were heated in 100 mL baths of each of 6 stripper solutions. Solutions A–C were comparative commercially available photoresist stripper solutions 4–6 were compositions of the present invention. The formulations of the samples are reported in Table 3.

TABLE 3

| Samples | Composition |
| --- | --- |
| A | 25% hydroxylamine, 62.5% diglycolamine, 12.5% water, 5% catechol |
| B | 60% monoethanolamine, 25% hydroxylamine, 10% water, 5% catechol |
| C | 37.5% NMP, 22.5% AEEA, 20% DPM, 20% TPM |
| 4 | 75% DMSO, 20% DPM, 3% TMAH, 2% benzotriazole |
| 5 | 70% sulfolane, 25% DPM, 3% TMAH, 2% benzotriazole |
| 6 | 75% DMSO, 20% DPM, 3% tetramethylammonium carbonate, 2% benzotriazole |

The baths containing the stripper solutions were heated to 75° C. The wafer pieces remained in the baths for 30 minutes. The wafer pieces were then removed from stripping solution baths and the solution in the bath was tested for dissolved copper using a HP-4500 inductively coupled plasma mass spectrometer ("ICP-MS") with a cold shield plasma method and utilizing the standard addition methods. The results are reported in Table 4.

TABLE 4

| Samples | Copper Level (ppb) |
| --- | --- |
| A | 7,865 |
| B | 8,640 |
| C | 11,060 |
| 4 | 326 |
| 5 | 285 |
| 6 | 186 |

From the above data it can be clearly seen that the stripping compositions of the present invention are much less corrosive to copper than known stripping compositions.

EXAMPLE 3

The procedure of Example 2 was repeated using a glass substrate containing an indium tin oxide/tantalum ("ITO/Ta") thin film and the stripper composition of Sample 4. No major corrosion of the metal layers was observed.

EXAMPLE 4

The procedure of Example 2 was repeated using a substrate containing a niobium/aluminum/niobium ("Nb/Al/Nb") thin film and the stripper composition of Sample 5. No major corrosion of the metal layers was observed.

EXAMPLE 5

The procedure of Example 2 was repeated using MR and GMR patterned wafers containing aluminum oxide thin films. Samples A–C showed corrosion while samples 4–6 showed a lower amount of corrosion than Samples A–C, with Sample 5 showing the lowest amount of corrosion.

EXAMPLE 6

The procedure of Example 2 was repeated except that various corrosion inhibitors were evaluated in the stripper composition of Sample 5. The corrosion inhibitors were evaluated for copper corrosion and rated on a scale of 1 to 10, 1 being the most corrosive and 10 being the least corrosive composition to the copper. The results are reported in Table 5.

TABLE 5

| Sample | Corrosion Inhibitor | Amount (% wt) | Rating |
| --- | --- | --- | --- |
| 7 | catechol | 2–5 | 7 |
| 8 | tert-butylcatechol | 2–5 | 8 |
| 9 | benzotriaxole | 2–5 | 10 |
| 10 | benzotriaole derivative | 2–5 | 9 |
| 11 | tetramethylammonium silicate | 5 | 9 |
| 12 | 2-mercaptobenzoimidazole | 2–5 | 9 |

The above data show that all the corrosion inhibitors are effective in the compositions of the present invention.

EXAMPLE 7

The procedure of Example 2 was repeated except that the substrate contained a titanium/titanium-nitride/aluminum-copper-silicon/titanium-nitride layer ("Ti/TiN/AlCuSi/TiN") containing 0.2 to 0.3 micron geometries and the stripper composition of Sample 5. No titanium or titanium-nitride corrosion was seen on 0.2 to 0.3 micron geometries and no titanium undercut was observed.

What is claimed is:

1. A composition for the removal of polymeric material from a substrate consisting essentially of one or more polar aprotic solvents, one or more polymer dissolution enhancing bases, one or more corrosion inhibitors selected from catechol, ($C_1$–$C_6$)alkylcatechol, benzotriazole, ($C_1$–$C_{10}$) alkylbenzotriazoles, ($C_1$–$C_{10}$)hydroxyalkylbenzotriazoles, 2-mercaptobenzimidazole, gallic acid, or gallic acid esters, and optionally one or more organic additives selected from cosolvents, surfactants and chelating agents, wherein the cosolvents are selected from ($C_1$–$C_{20}$)alkanediols or ($C_1$–$C_{20}$)alkanediol ($C_1$–$C_6$)alkyl ethers, and wherein the one or more polymer dissolution enhancing bases are present in an amount of from 1 to 5% wt, based on the total weight of the composition.

2. The composition of claim 1 wherein the polar aprotic solvent is selected from dimethyl sulfoxide, tetramethylene sulfone or dimethyl su in an amount of from about 20% wt to about 90% wt, based on the total weight of the composition.

3. The composition of claim 1 wherein the polar aprotic solvents are present in an amount of from about 20% wt to about 90% wt, based on the total weight of the composition.

4. The composition of claim 1 wherein the polymer dissolution enhancing base is selected from tetramethylammonium hydroxide; tetrabutylammonium hydroxide; tetramethylammonium carbonate; tetramethylammonium acetate; tetramethylammonium citrate; tetramethylammonium silicate; or choline hydroxide.

5. The composition of claim 1 wherein the corrosion inhibitor is selected from catechol, methylcatechol, ethylcatechol, tert-butylcatechol, benzotriazole, 2-mercaptobenimidazole, gallic acid, methyl gallate or propyl gallate.

6. The composition of claim 1 wherein the corrosion inhibitor is present in an amount of from about 0.01 to about 10% wt, based on the total weight of the composition.

7. The composition of claim 1 wherein the cosolvent is selected from propylene glycol monomethyl ether, propylene glycol dimethyl ether, propylene glycol n-butyl ether, dipropylene glycol monomethyl ether, dipropylene glycol dimethyl ether, dipropyleneglycol n-butyl ether, tripropylene glycol monomethyl ether and propylene glycol methyl ether acetate.

8. The composition of claim 1 wherein the cosolvent is present in an amount of from about 5 to about 80% wt, based on the total weight of the composition.

9. A method of removing polymeric material from a substrate including the step of contacting a substrate containing polymeric material to be removed with the composition of claim 1.

10. A method for preparing thin film heads comprising the steps of contacting a thin film head precursor containing polymeric material to be removed with a composition consisting essentially of one or more polar aprotic solvents, one or more polymer dissolution enhancing bases selected from tetra($C_1$–$C_4$)alkylammonium hydroxide, tetra ($C_1$–$C_4$) alkylammonium carbonate, tetra($C_1$–$C_4$)alkylammonium acetate, tetra($C_1$–$C_4$)alkylammonium citrate, tetra($C_1$–$C_4$) alkylammonium silicate or choline hydroxide, one or more corrosion inhibitors selected from catechol, ($C_1$–$C_6$) alkylcatechol, benzotriazole, ($C_1$–$C_{10}$)alkylbenzotriazoles, ($C_1$–$C_{10}$)hydroxyalkylbenzotriazoles, 2-mercaptobenzimidazole, gallic acid, or gallic acid esters, and optionally one or more organic additives selected from cosolvents, surfactants and chelating agents, wherein the cosolvents are selected from ($C_1$–$C_{20}$)alkanediols or ($C_1$–$C_{20}$)alkanediol($C_1$–$C_6$)alkyl ethers, and wherein the one or more polymer dissolution enhancing bases are present in an amount of from 1 to 5% wt, based on the total weight of the composition, for a period of time sufficient to remove the polymeric material and rinsing the substrate.

* * * * *